(12) United States Patent
Kawagishi et al.

(10) Patent No.: US 7,488,903 B2
(45) Date of Patent: Feb. 10, 2009

(54) METHOD FOR MANUFACTURING CIRCUIT MODULES AND CIRCUIT MODULE

(75) Inventors: Makoto Kawagishi, Komatsu (JP); Tsutomu Ieki, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/107,163

(22) Filed: Apr. 22, 2008

(65) Prior Publication Data
US 2008/0210462 A1 Sep. 4, 2008

Related U.S. Application Data

(63) Continuation of application No. PCT/JP2006/318495, filed on Sep. 19, 2006.

(30) Foreign Application Priority Data
Nov. 28, 2005 (JP) ............... 2005-342012

(51) Int. Cl.
*H05K 9/00* (2006.01)
(52) U.S. Cl. .................. 174/385; 174/386; 174/377; 174/521; 257/659; 438/110; 438/113; 438/124
(58) Field of Classification Search ................ 174/385, 174/386, 377, 521; 361/816, 818, 800; 257/659, 257/660; 438/110, 113, 124
See application file for complete search history.

(56) References Cited

U.S. PATENT DOCUMENTS

| | | | |
|---|---|---|---|
| 6,865,084 B2 * | 3/2005 | Lin et al ............. | 361/704 |
| 6,998,532 B2 | 2/2006 | Kawamoto et al. | |
| 7,109,410 B2 * | 9/2006 | Arnold et al. ........ | 174/390 |
| 7,368,812 B2 * | 5/2008 | Akram ................. | 257/686 |
| 7,382,046 B2 * | 6/2008 | Tashiro et al. ....... | 257/704 |
| 7,411,278 B2 * | 8/2008 | Wen et al. ........... | 257/659 |
| 7,445,968 B2 * | 11/2008 | Harrison et al. ..... | 428/124 |
| 2005/0039946 A1 | 2/2005 | Nakao | |

FOREIGN PATENT DOCUMENTS

EP 1 631 137 A1 1/2006

(Continued)

OTHER PUBLICATIONS

Official communication issued in the International Application No. PCT/JP2006/318495, mailed on Nov. 21, 2006.

*Primary Examiner*—Hung V Ngo
(74) *Attorney, Agent, or Firm*—Keating & Bennett, LLP

(57) ABSTRACT

A module substrate defined by an aggregate substrate is prepared, and circuit components are mounted on the module substrate. An insulating resin layer is formed on substantially the entire top surface of the module substrate such that the circuit components are disposed in the insulating resin layer, and a top-surface-shielding layer is formed on the top surface of the insulating resin layer. First through holes are formed in the module substrate and the insulating resin layer at locations corresponding to portions of boundary lines of small substrates so as to extend in a thickness direction of the module substrate and the insulating resin layer. First electrode films are formed on the inner surfaces of the first through holes so as to be connected to the first shielding layer, and the first through holes are filled with a filling material. Next, second through holes are formed at locations corresponding to the remaining portions of the boundary lines of small substrates so as to extend in the thickness direction, and second electrode films are formed on the inner surfaces of the second through holes so as to be connected to the top-surface-shielding layer and the first electrode films. The filling material, with which the first through holes are filled, is cut along the boundary lines of small substrates, resulting in a division of the aggregate substrate into small substrates to obtain circuit modules.

26 Claims, 11 Drawing Sheets

FOREIGN PATENT DOCUMENTS

| | | |
|---|---|---|
| JP | 05-67039 U | 9/1993 |
| JP | 08-236979 A | 9/1996 |
| JP | 11-163583 A | 6/1999 |
| JP | 2005-109306 A | 4/2005 |
| JP | 2005-159227 A | 6/2005 |
| JP | 2005-276980 A | 10/2005 |

* cited by examiner

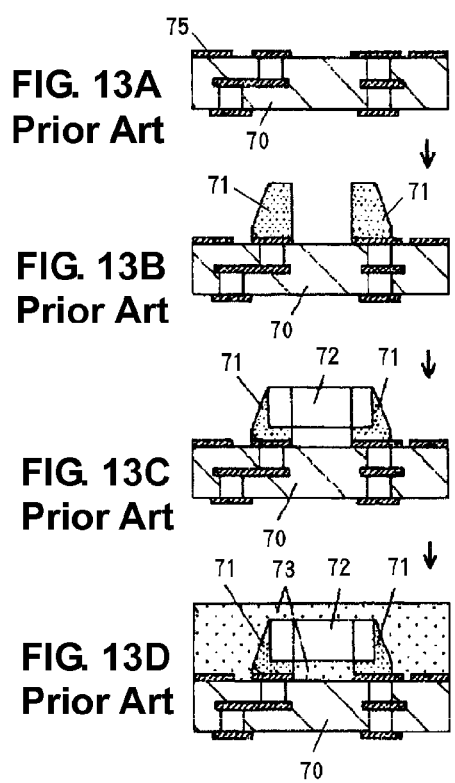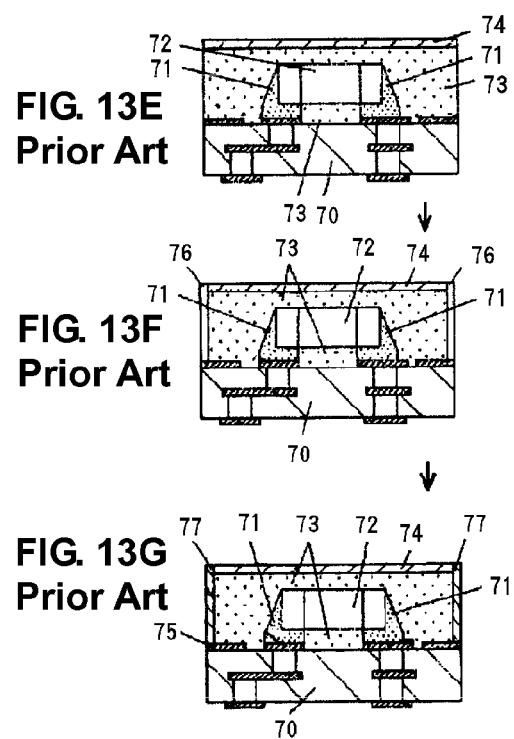
FIG. 13A Prior Art
FIG. 13B Prior Art
FIG. 13C Prior Art
FIG. 13D Prior Art
FIG. 13E Prior Art
FIG. 13F Prior Art
FIG. 13G Prior Art

METHOD FOR MANUFACTURING CIRCUIT MODULES AND CIRCUIT MODULE

BACKGROUND OF THE INVENTION

1. Field of the Invention

The present invention relates to a circuit module in which a component-embedding substrate is used, and more particularly, the present invention relates to a circuit module having a function of an electromagnetic shield, and to a method for manufacturing such circuit modules.

2. Description of the Related Art

In the related art, circuit modules, such as voltage-controlled oscillators (VCOs) and antenna switches, are used in radio apparatuses, such as mobile phones, automobile telephones, and various types of communication apparatuses. A known circuit module has a configuration in which a leakage of an electromagnetic wave generated by a circuit component mounted on a module substrate can be avoided or in which the periphery of the circuit module is covered by shielding electrodes in order to block an electromagnetic wave that enters the circuit module from the outside.

FIG. 12 shows an example of a circuit module having a function of an electromagnetic shield. On the surface of a wiring substrate 60, a ground electrode 61 and an input-output electrode 62 are provided, and, on the back surface of the wiring substrate 60, terminal electrodes 63 are provided. In the wiring substrate 60, inner via-holes 64 and internal wiring patterns 65 are provided. A circuit component 66 is bonded to the ground electrode 61 and the input-output electrode 62 using a conductive bonding material 67, such as solder or a conductive adhesive. Subsequently, the top of the wiring substrate 60 is covered by an insulating resin layer 68 such that the circuit component 66 is disposed in the insulating resin layer 68, and the external surface of the insulating resin layer 68 and the peripheral surfaces of the wiring substrate 60 are covered by electromagnetically shielding layers 69.

In order to manufacture the circuit module with outstanding productivity, the wiring substrate 60, which is an aggregate substrate, is prepared, and the circuit component 66 is mounted on the wiring substrate 60. Then, the wiring substrate 60 and the circuit component 66 are sealed with the insulating resin layer 68, and divided into small substrates. Subsequently, the electromagnetically shielding layers 69 are provided. On the top surface of the insulating resin layer 68, one of the electromagnetically shielding layers 69 can be formed in the aggregate substrate state. However, on the side surfaces of the insulating resin layer 68 and the wiring substrate 60, the electromagnetically shielding layers 69 must be formed after the division into small substrates. Consequently, this leads to a problem that the productivity is decreased, and inconsistent quality often occurs.

In Japanese Unexamined Patent Application Publication No. 2005-159227, a circuit module in which shielding layers are provided so as to cover the surfaces surrounding a surface that a component is mounted on and the productivity of which is excellent is provided.

FIGS. 13A to 13G show an example of a manufacturing process of the circuit module disclosed in Japanese Unexamined Patent Application Publication No. 2005-159227. The process includes the steps of preparing a multi-layered wiring substrate 70 that is an aggregate substrate (FIG. 13A), printing solder or a conductive adhesive 71 on the wiring substrate 70 (FIG. 13B), mounting a circuit component 72 (FIG. 13C), forming an insulating resin layer 73 (FIG. 13D), forming a shielding layer 74 on the top surface, and then, curing the insulating resin layer 73 by heat treatment (FIG. 13E), providing cutting grooves 76 in the insulating resin layer 73 at boundary portions between adjacent small substrates such that ground electrodes 75, which are formed on the wiring substrate 70, are exposed (FIG. 13F), filling and performing heat-curing of a conductive material 77 in the cutting grooves 76 (FIG. 13G), and cutting the conductive material 77 along the cutting grooves 76 using a blade having a width less than that of the cutting grooves 76, so to be divided into pieces.

However, in the circuit module having the above-described configuration, the depth of the cutting grooves, which are to be filled with the conductive material defining a shield, extends only to a plane providing an exposure of the ground electrode, which is formed on the surface of the wiring substrate. The depth of the cutting grooves can be set such that the cutting grooves extend into the wiring substrate 70. However, in order to ensure the mechanical strength of the aggregate substrate when being filled with the conductive material, it is difficult to provide cutting grooves having a very large depth. For this reason, it is difficult to use a wiring substrate having a very small thickness, and this causes the side surfaces of the wiring substrate to have portions on which no shielding layer is formed. Thus, a problem occurs in that it is difficult to obtain a sufficient shielding property.

As in Japanese Unexamined Patent Application Publication No. 2005-159227, it is not easy to precisely equalize the depth of cutting grooves to a depth corresponding to a height providing an exposure of ground electrodes formed on the surface of a wiring substrate. There is a probability that the ground electrodes may be damaged or cut. This causes the decrease in productivity.

SUMMARY OF THE INVENTION

To overcome the problems described above, preferred embodiments of the present invention provide a method for manufacturing circuit modules and a circuit module capable of being easily manufactured and having an excellent shielding property.

A method for manufacturing circuit modules according to a first preferred embodiment of the present invention includes the steps of preparing a module substrate that is an aggregate substrate including a plurality of small substrates, mounting circuit components on the module substrate, forming an insulating resin layer on substantially the entire top surface of the module substrate such that the circuit components are disposed in the insulating resin layer, forming a first shielding layer on the top surface of the insulating resin layer, forming first through holes in the module substrate and the insulating resin layer at locations corresponding to portions of boundary lines of small substrates so as to extend in a thickness direction of the module substrate and the insulating resin layer, forming first electrode films on the inner surfaces of the first through holes so as to be connected to the first shielding layer, filling the first through holes with a filling material, forming second through holes in the module substrate and the insulating resin layer at locations corresponding to the remaining portions of the boundary lines of small substrates so as to extend in the thickness direction of the module substrate and the insulating resin layer, forming second electrode films on the inner surfaces of the second through holes so as to be connected to the first shielding layer and the first electrode films, and cutting the filling material, with which the first through holes are filled, along the boundary lines of small substrates, resulting in a division into small substrates.

A method for manufacturing circuit modules according to a second preferred embodiment of the present invention includes the steps of preparing a module substrate that is an aggregate substrate including a plurality of small substrates, mounting circuit components on the module substrate, forming an insulating resin layer on substantially the entire top surface of the module substrate such that the circuit components are disposed in the insulating resin layer, forming a first shielding layer on the top surface of the insulating resin layer, forming first through holes in the module substrate and the insulating resin layer at locations corresponding to portions of boundary lines of small substrates so as to extend in a thickness direction of the module substrate and the insulating resin layer, filling the first through holes with a conductive filling material, forming second through holes in the module substrate and the insulating resin layer at locations corresponding to the remaining portions of the boundary lines of small substrates so as to extend in the thickness direction of the module substrate and the insulating resin layer, forming electrode films on the inner surfaces of the second through holes so as to be connected to the first shielding layer and the conductive filling material, and cutting the conductive filling material, with which the first through holes are filled, along the boundary lines of small substrates, resulting in a division into small substrates.

The manufacturing method according to the first preferred embodiment of the present invention will now be described. First, a module substrate that is an aggregate substrate is prepared, and, on the module substrate, circuit components are mounted. Next, an insulating resin layer is formed on substantially the entire top surface of the module substrate such that the circuit components are disposed in the insulating resin layer. On the top surface of the insulating resin layer, a first shielding layer is formed. To form the insulating resin layer and the first shielding layer, a method can be used in which, for example, a metallic foil defining the first shielding layer is disposed on the top surface of the insulating resin layer that is in a B-stage state (a semi-cured state), and in which the insulating resin layer is press-bonded and cured on the module substrate. A method may also be used in which an insulating resin is molded on the module substrate, and in which, after the insulating resin is cured, an electrode defining the first shielding layer is formed on the top surface of the insulating resin layer by electroless plating or other suitable method. Alternatively, any suitable method for forming the insulating resin layer and the first shielding layer may be used.

Then, in the module substrate and the insulating resin layer, the first through holes are formed in the module substrate and the insulating resin layer at locations corresponding to portions of the boundary lines of small substrate so as to extend in the thickness direction of the module substrate and the insulating resin layer. The through holes can be easily formed by punching, using a drill, a laser, or other suitable device. Any location and any form of the through holes may be used. For example, as the through holes, holes may be formed at locations corresponding to four corner portions of small substrates, or long holes may be formed at locations corresponding to two opposed sides. Next, the first electrode films are formed on the inner surfaces of the through holes so as to be connected to the first shielding layer. The electrode films can be formed so as to cover at least the peripheral portion of the first shielding layer using a known method, such as plating. Then, the first through holes are filed with the filling material. The filling material defines a cross-linking material among small substrates. Preferably, the filling material has a desired fixing strength in a cured state, and is a filling material that is easily cut. For example, a resin material or solder can be used.

Next, the second through holes are formed in the module substrate and the insulating resin layer at locations corresponding to the remaining portions of the boundary lines of small substrates so as to extend in the thickness direction of the module substrate and the insulating resin layer. When the first through holes are formed at locations corresponding to corner portions of each small substrate, the second through holes can be formed as long holes that are formed at locations corresponding to four sides of the small substrate. When the first through holes are long holes that are formed at locations corresponding to two opposed sides of each small substrate, the second through holes can be formed as long holes at locations corresponding to the other two sides of the small substrate. Because the second through holes are formed, there is a risk that the aggregate substrate is to be divided into small substrates. However, since small substrates are connected to one another using the filling material, with which the first through holes are filled, as described above, the aggregate substrate is not likely to be divided. In this state, the second electrode films are formed on the inner surfaces of the second through holes so as to be connected to the first shielding layer and the first electrode films. The second electrode films can be formed in a manner similar to that used for the first electrode films. Finally, the filling material, which connects small substrates to one another and with which the first through holes are filled, is cut along the boundary lines of the small substrates, resulting in the division into small substrates.

As described above, the top surface of each small substrate (the top surface of the insulating resin layer) is covered by the first shielding layer, and all of the side surfaces of the small substrate are covered by the second shielding layer (the first and second electrode films), which is electrically connected to the first shielding layer. Thus, a problem in the related art that it is impossible to form shielding layers on the peripheral surfaces of the module substrate in a state of an aggregate substrate is overcome, and circuit modules having outstanding shielding properties can be obtained. Additionally, because the first and second shielding layers have already been formed prior to the division into small substrate, there is no need to form any shielding layer after the division into small substrates. Accordingly, no subsequent process is required in the state of small substrates. Furthermore, because all of the holes that are processed in the state of an aggregate substrate and used to form a side-surface shield are through holes, unlike in the case of cutting grooves disclosed in Japanese Unexamined Patent Application Publication No. 2005-159227, the depth does not need to be strictly controlled and no damage occurs to electrodes.

Next, the manufacturing method according to the second preferred embodiment will be described. In the manufacturing method according to the first preferred embodiment, after the first electrode films are formed on the inner surfaces of the first through holes, the first through holes are filled with the filling material defining a cross-linking material. The manufacturing method according to the second preferred embodiment is different from the manufacturing method according to the first preferred embodiment in that the first through holes are filled with the conductive filling material without forming any electrode film in the first through holes. In other words, the conductive filling material is formed as a portion of the second shielding layer, and the conductive filling material defines a cross-linking material that retains the small substrates in a combined state until the second through holes are formed and the electrode films are formed on the inner surfaces of the second through holes. As the conductive filling material, for example, a conductive resin composition can be used. In this case, the second shielding layer is formed of the conductive filling material, with which the first through holes are filled, and the electrode films, which are formed on the inner surfaces of the second through holes.

The manufacturing method according to the second preferred embodiment has an advantage in that two steps included in the first manufacturing method, i.e., forming the first electrode films and filling the first electrodes with the filling material, can be combined into one step of filling the first through holes with the conductive filling material, which results in a decrease of the number of steps.

When the first through holes are formed at locations corresponding to corner portions of each small substrate, the second through holes are formed at locations corresponding to four sides of the small substrate, and a module circuit is manufactured using the manufacturing method according to the first preferred embodiment, a configuration is provided in which concave grooves are formed in four corner portions of the module substrate and the insulating resin layer so as to extend in the thickness direction of the module substrate and the insulating resin layer, in which the electrode films are formed on the inner surfaces of the concave grooves so as to be formed as a portion of the second shielding layer, and in which the concave grooves are filled with the filling material such that the filling material covers the electrode films. Similarly, when a module circuit is manufactured using the manufacturing method according to the second preferred embodiment, a configuration is provided in which concave grooves are formed in four corner portions of the module substrate and the insulating resin layer so as to extend in the thickness direction of the module substrate and the insulating resin layer, and in which the concave grooves are filled with the conductive filling material that is formed as a portion of the second shielding layer. Conversely, a method may be used in which the first through holes are formed at the locations corresponding to four sides of each small substrate, and in which the second through holes are formed in the four corner portions.

When the first through holes are formed at locations corresponding to two opposed sides of each small substrate, the second through holes are formed at locations corresponding to the other two sides of the small substrate, and a module circuit is manufactured using the manufacturing method according to the first preferred embodiment, a configuration is provided in which the electrode films that are formed as a portion of the second shielding layer are exposed on the side surfaces corresponding to two opposed sides of the module substrate and the insulating resin layer, in which the electrode films that are formed as the other portion of the second shielding layer are formed on the side surfaces corresponding to two sides other than the two sides and in which the electrode films are covered by the filling material. Similarly, when a module circuit is manufactured using the manufacturing method according to the second preferred embodiment, a configuration is provided in which the electrode films that are formed as a portion of the second shielding layer are exposed on the side surfaces corresponding to two opposed sides of the module substrate and the insulating resin layer, and in which the other two sides are covered by the conductive filling material that is formed as the other portion of the second shielding layer.

Ground terminal electrodes may be formed on the bottom surface of the module substrate, and a bottom edge portion of the second shielding layer may be connected to the ground terminal electrodes. With this configuration, when the circuit module is mounted on a mounting board, such as a motherboard, the shielding layer of the circuit module can be easily connected to the ground potential.

Preferably, the electrode films are formed by plating. By using plating, the manufacturing methods have an advantage in that a plurality of aggregate substrates can be processed at the same time, and in that electrode films having substantially the same thickness can be formed.

Preferably, the filling material includes a thermosetting resin. Because a thermosetting resin, such as an epoxy resin, has a strong bonding strength in a cured state, the thermosetting resin is a preferable cross-linking material that connects the small substrates with one another.

As described above, in the methods for manufacturing circuit modules according to preferred embodiments of the present invention, in a step prior to the division into small substrates, the first and second shielding layers are already formed. Accordingly, there is no need to form any shielding layer after the division into small substrates, which results in a significant increase in productivity. Additionally, because all of the holes that are processed in the state of an aggregate substrate and used to form a side-surface shield are through holes, unlike in the case of cutting grooves in the related art, the depth does not need to be strictly controlled, and no damage occurs to the electrodes. Accordingly, the manufacturing methods according to preferred embodiments of the present invention have an advantage in that the productivity is further increased.

In the circuit modules according to preferred embodiments of the present invention, because the shielding layers can be formed on all of the surfaces except the back surface, a shielding effect from radiation from the circuit components and internal wiring patterns, for example, and a shielding effect from extraneous noise can be obtained. Thus, the occurrence of malfunctions can be minimized.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIGS. 13A to 13G include views showing a manufacturing process of another example of the circuit module in the related art.

DETAILED DESCRIPTION OF PREFERRED EMBODIMENTS

Preferred embodiments of the present invention will be described below.

First Preferred Embodiment

Figure 1:
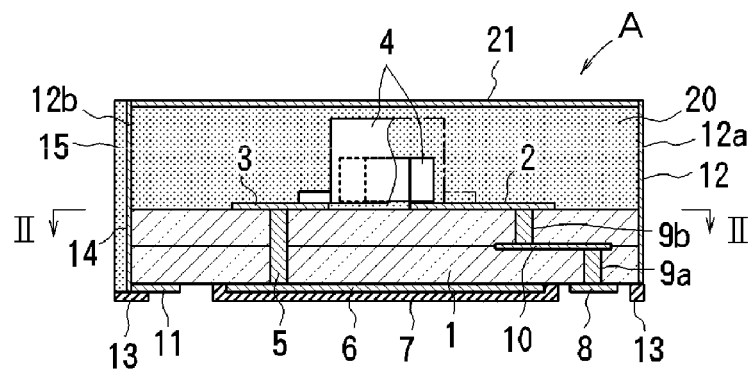
FIG. 1 is a sectional view of a circuit module according to a first preferred embodiment of the present invention.
Figure 2:
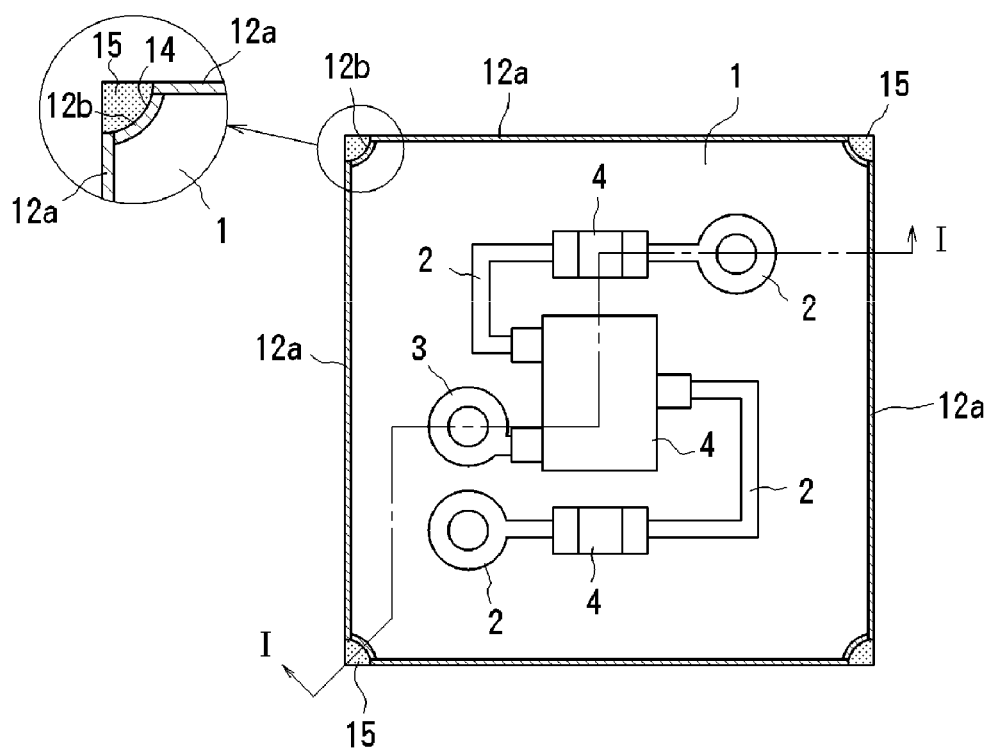
FIG. 2 is a sectional view taken along the line II-II of FIG. 1.
Figure 3:
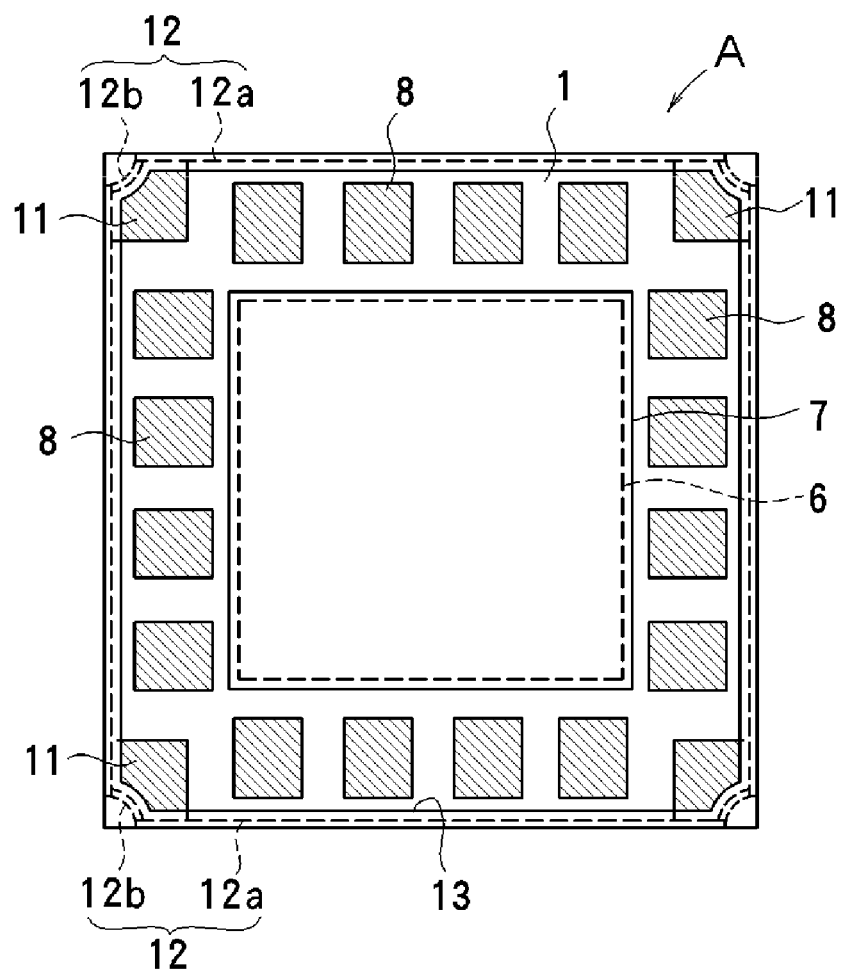
FIG. 3 is a bottom view of a module substrate of the circuit module shown in FIG. 1.

In FIGS. 1 to 3, a circuit module according to a first preferred embodiment of the present invention is shown. FIG. 1 is a sectional view taken along the step-formed cutting-plane line (the line I-I) of FIG. 2. FIG. 2 is a sectional view taken along the line II-II of FIG. 1. FIG. 3 is a bottom view.

A circuit module A includes a module substrate 1 that is a substrate having an insulating property, such as a multi-layered resin substrate, and that has a square or substantially square shape, for example. On the top surface of the module substrate 1, wiring electrodes 2, for example, used for inputs and outputs, and a ground electrode 3 are provided. To the electrodes 2 and 3, circuit components 4 including active components, such as transistors used for power amplifiers, and passive components, such as capacitors, are connected. The specific patterns of the wiring electrodes 2 and the ground electrode 3 shown in FIG. 2 are provided only as examples. Additionally, the circuit components 4 shown in FIGS. 1 and 2, which are connected to the electrodes 2 and 3, are not limited thereto. Furthermore, the module substrate 1 may be configured as a single layer.

The ground electrode 3 is connected through a via-hole conductor 5 to a shielding electrode 6 that is provided on the central portion of the back surface of the module substrate 1. The shielding electrode 6 is covered by a solder-resist film 7 that is formed on the back surface of the module substrate 1. On the outer portion of the back surface of the module substrate 1, terminal electrodes 8 are arranged so as to surround the shielding electrode 6. The terminal electrodes 8 are connected through via-hole conductors 9a and 9b and inner electrodes 10 to the wiring electrodes 2, which are provided on the top surface of the module substrate 1. All of the terminal electrodes 8 are not required to be connected to the wiring electrodes 2. Some of the terminal electrodes 8 may be connected to the ground electrode 3 or other electrodes. On the corner portions of the back surface of the module substrate 1, ground terminal electrodes 11 are provided. The ground terminal electrodes 11 are connected via side-surface-shielding layers (second shielding layers) 12 to a top-surface-shielding layer 21, which is described below and provided on the top surface of an insulating resin layer 20. The bottom ends of the side-surface-shielding layers 12, which are exposed on the back surface of the module substrate 1, are covered by a solder-resist film 13 that is formed in a frame shape.

The insulating resin layer 20 is provided on the top surface of the module substrate 1 such that the circuit components 4 are disposed in the insulating resin layer 20. The insulating resin layer 20 is a resin composition, for example, that is composed of a thermosetting resin, or a mixture of a thermosetting resin and an inorganic filler. The thickness of the insulating resin layer 20 is greater than a thickness corresponding to the maximum height of the circuit components 4, and the top surface of the insulating resin layer 20 is formed as a flat plane. On the top surface of the insulating resin layer 20, the top-surface-shielding layer (the first shielding layer) 21 is formed of a copper foil or other suitable material.

The side surfaces of the module substrate 1 are formed so as to be flush with the side surfaces of the insulating resin layer 20. On the side surfaces, electrode films 12a are continuously formed. The electrode films 12a are formed by plating or other suitable formation method. In the corner portions of the module substrate 1 and the insulating resin layer 20, concave grooves 14 having a substantially quarter-arc shape are formed continuously in a thickness direction of the module substrate 1 and the insulating resin layer 20. On the inner surfaces of the concave grooves 14, electrode films 12b are formed by plating or other suitable formation method. The electrode films 12b are connected to the electrode films 12a, and the side-surface-shielding layers 12 are defined by both the electrode films 12a and 12b. The side-surface-shielding layers 12 cover substantially the entire side periphery (all of the side surfaces) of the circuit module A, and are also connected to the top-surface-shielding layer 21 along substantially the entire peripheral edge of the top-surface-shielding layer 21, which is provided on the top surface of the insulating resin layer 20.

The concave grooves 14 are filled with a filling material 15, and the filling material 15 covers the electrode films 12b. As the filling material 15, a thermosetting resin, a cold-setting resin, solder, or other suitable material can be used. Preferably, the same type of resin as that used in the module substrate 1 or the insulating resin layer 20 is used.

As described above, because all of the surfaces except for the back surface of the circuit module A are covered by the shielding layers 12 and 21, a sufficient shielding effect from radiation from the circuit components 4 and internal wiring patterns, and a shielding effect from extraneous noise can be obtained. Additionally, since the shielding electrode 6 is provided on the central portion of the back surface of the circuit module A, improved shielding properties can be obtained.

Figure 4A:
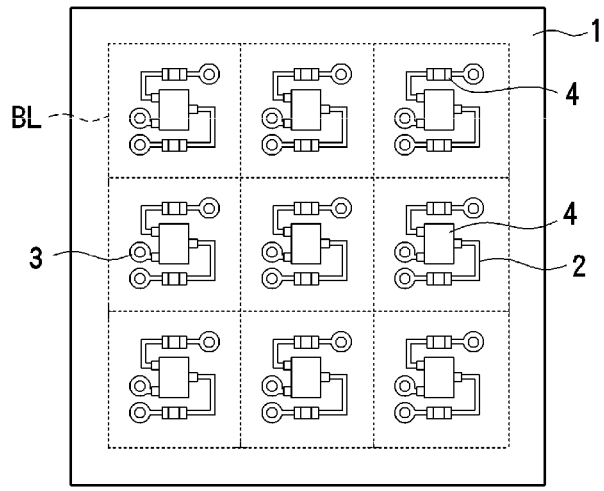
FIGS. 4A to 4C include plan views showing the first half of a manufacturing process of the circuit module shown in FIG. 1.
Figure 4B:
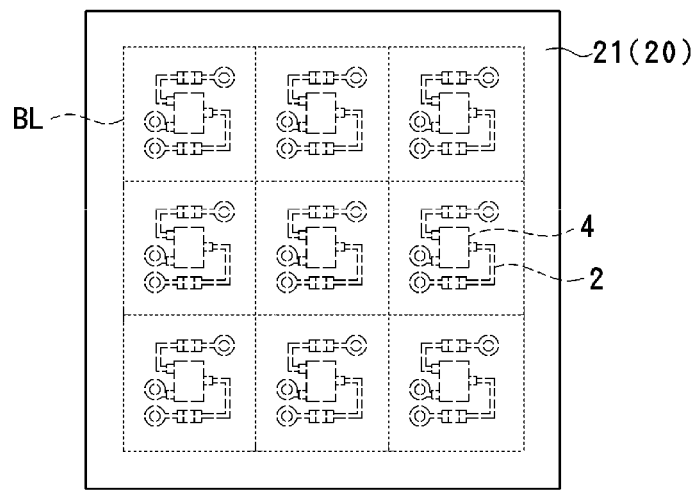

Next, an example of a method for manufacturing circuit modules having the above-described configuration will be described with reference to FIGS. 4A, 4B, and 5. FIGS. 4A and 4B include plan views. FIG. 5 includes sectional views taken along the step-formed cutting-plane line similar to that of FIG. 1.

Figure 5A:
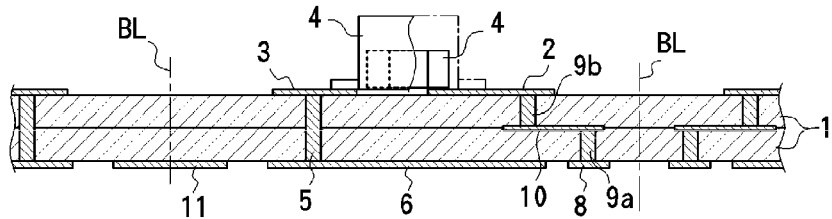
FIGS. 5A to 5F include sectional views showing the manufacturing process of the circuit module shown in FIG. 1.

In FIG. 4A and FIG. 5A, a state is shown in which the module substrate 1, on the top surface of which the circuit components 4 are mounted in advance, is prepared. The module substrate 1 is an aggregate substrate including a plurality of small substrates that is to be divided along boundary lines BL. A method for mounting the circuit components 4 is not limited to soldering. The circuit components 4 may be mounted face down using bumps, or wire bonding may be used after the circuit components 4 are fixed.

Figure 5B:
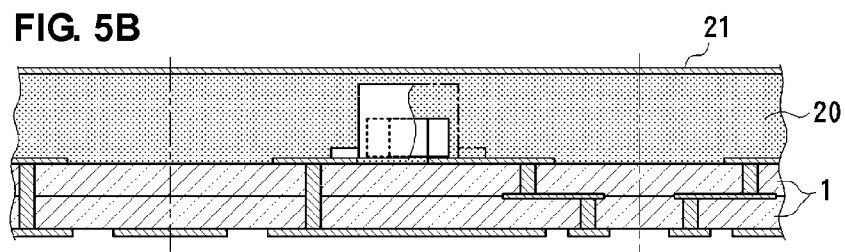

In FIG. 4B and FIG. 5B, a state is shown in which the insulating resin layer 20 is formed on substantially the entire top surface of the module substrate 1 such that the circuit components 4 are disposed in the insulating resin layer 20, and in which, on the top surface of the insulating resin layer 20, the top-surface-shielding layer 21 is formed. As a method for forming the insulating resin layer 20 and the top-surface-shielding layer 21, for example, a method can be used in which a metallic foil that defines the top-surface-shielding layer 21 is disposed on the top surface of the insulating resin layer 20 that is in a B-stage state (a semi-cured state), and in which the insulating resin layer 20 is press-bonded and cured on the module substrate 1. A method may also be used in which a insulating resin is molded and cured on the module substrate 1, and in which the top-surface-shielding layer 21 is formed on the top surface of the insulating resin layer 20 by electroless plating or other suitable method. Alternatively, any method for forming the insulating resin layer 20 and the top-surface-shielding layer 21 may be used.

Figure 4C:
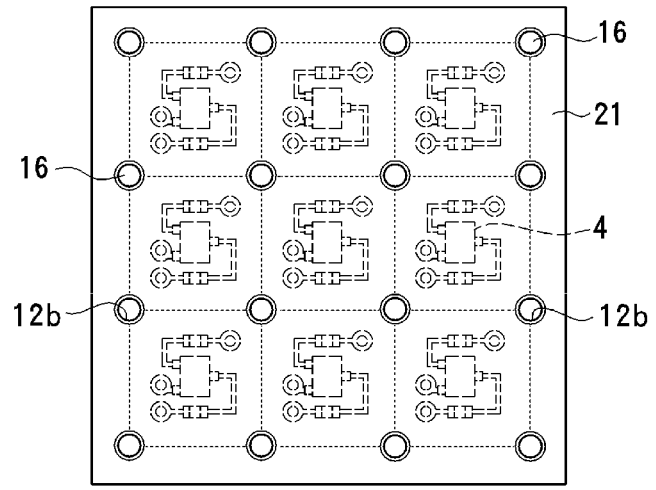
Figure 5C:
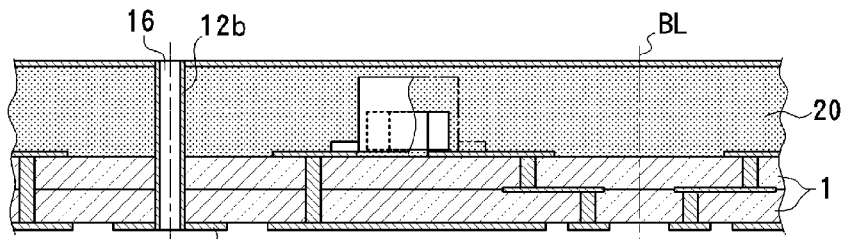

In FIG. 4C and FIG. 5C, a state is shown in which first through holes 16 are formed in the module substrate 1 and the insulating resin layer 20 at locations corresponding to the corner portions of each small substrate so as to pass through in a thickness direction of the module substrate 1 and the insulating resin layer 20. In this preferred embodiment, the first through holes 16 preferably are round holes. However, angled holes or holes in the shape of a cross, for example, may be used. The first through holes 16 are formed by punching, using a drill, using a laser, or other suitable device. Then, on the inner surfaces of the first through holes 16, the electrode films 12b are formed by electroless plating or other suitable method so as to be connected to the top-surface-shielding layer 21.

Figure 4D:
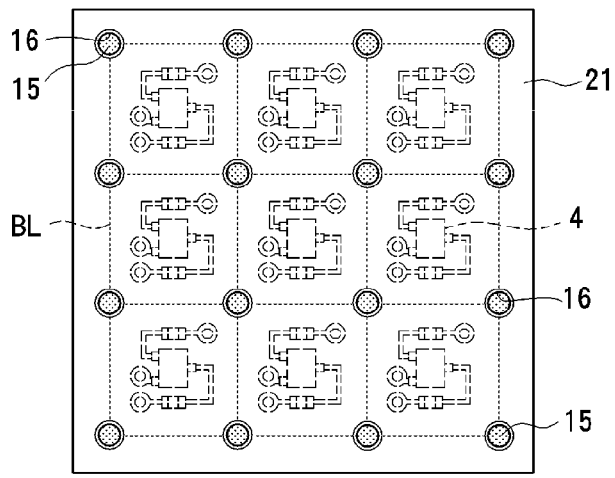
FIGS. 4D to 4F include plan views showing the second half of the manufacturing process of the circuit module shown in FIG. 1.
Figure 5D:
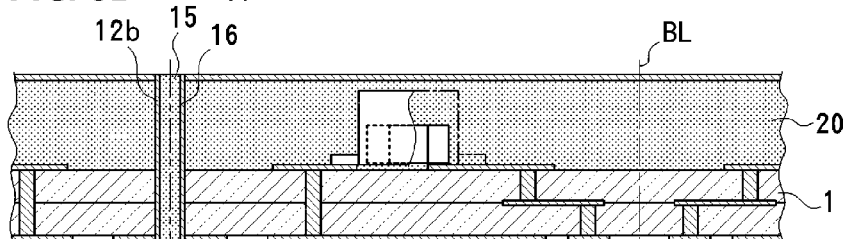

In FIG. 4D and FIG. 5D, a state is shown in which the first through holes 16 are filled with filling material 15. After filling the first through holes 16 with the filling material 15, the filling material 15 is cured.

Figure 4E:
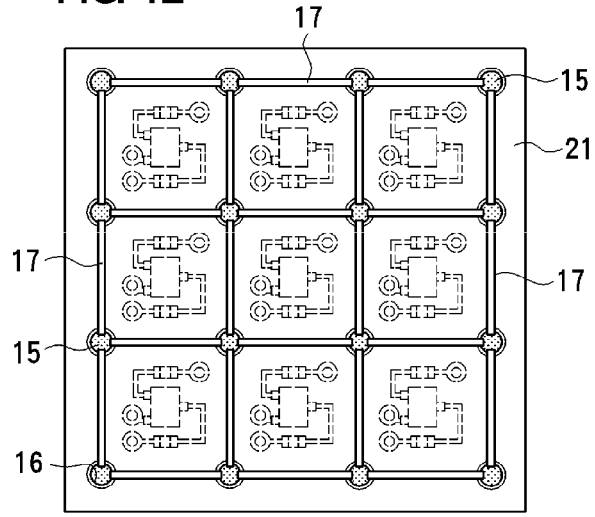
Figure 5E:
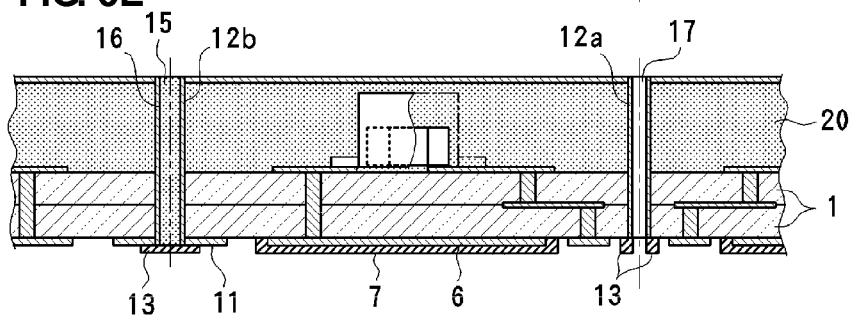

In FIG. 4E and FIG. 5E, a state is shown in which second through holes 17 are formed in the module substrate 1 and the insulating resin layer 20 along the boundary lines BL, i.e., at locations corresponding to four sides of each small substrate so as to pass through in the thickness direction of the module substrate 1 and the insulating resin layer 20. The second through holes 17 are long holes having a width less than a diameter of the first through holes 16. Both ends of each of the second through holes 17 extend to the filling material 15, with which the first through holes 16 are filled. In other words, both ends of each of the second through holes 17 extend to locations at which the electrode films 12b, which are formed on the inner surfaces of the first through holes 16, are cut. However, to retain the small substrates in a combined state among one another, each of the second through holes 17 must end before each end of the second through hole 17 extends to the center of a corresponding one of the first through holes 16. The second through holes 17 are formed by punching, slicing, using a laser, or other suitable device.

After the second through holes 17 are formed, on the inner surfaces of the second through holes 17, the electrode films 12a are formed by electroless plating or other suitable method so as to be connected to the top-surface-shielding layer 21 and the electrode films 12b. When the electrode films 12a are formed, small substrates are retained in the combined state by the filling material 15. Accordingly, the electrode films 12a can be formed in as an aggregate substrate. Additionally, after the electrode films 12a are formed, as shown in FIG. 5E, the solder-resist films 7 and 13 are formed on the back surface of the module substrate 1, if necessary.

Figure 4F:
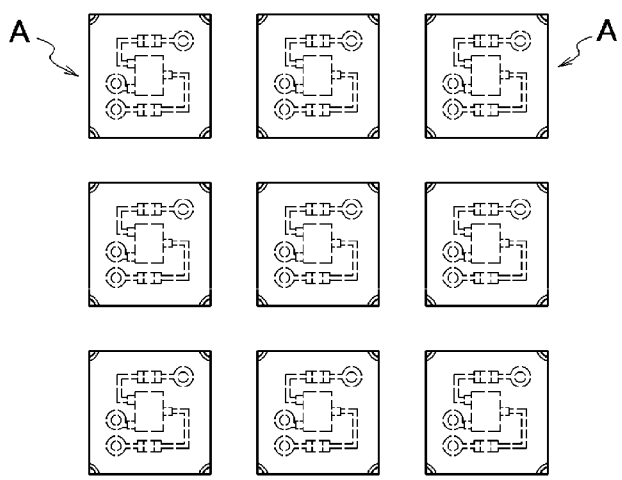
Figure 5F:
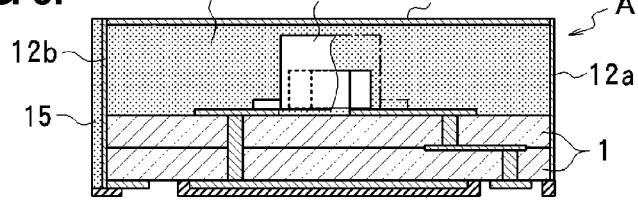

In FIG. 4F and FIG. 5F, a state is shown in which the module substrate 1 and the insulating resin layer 20 are divided into small substrates (circuit modules A). When the module substrate 1 and the insulating resin layer 20 are divided, only the filling material 15 is cut. Accordingly, the module substrate 1 and the insulating resin layer 20 can be easily divided using a laser or other suitable device.

As described above, in the aggregate substrate (in a step before the division into small substrates), the top-surface-shielding layer 21 and the side-surface-shielding layers 12 (the electrode films 12a and 12b) have already been formed. Accordingly, there is no need to form any shielding layer after the small substrates are divided, which enables significantly increased productivity. Furthermore, because all holes processed in the aggregate substrate are the first through holes 16 and the second through holes 17, unlike cutting grooves as in the related art, there is no need to strictly control the depth, and no damage occurs in the electrodes.

Second Preferred Embodiment

Figure 6:
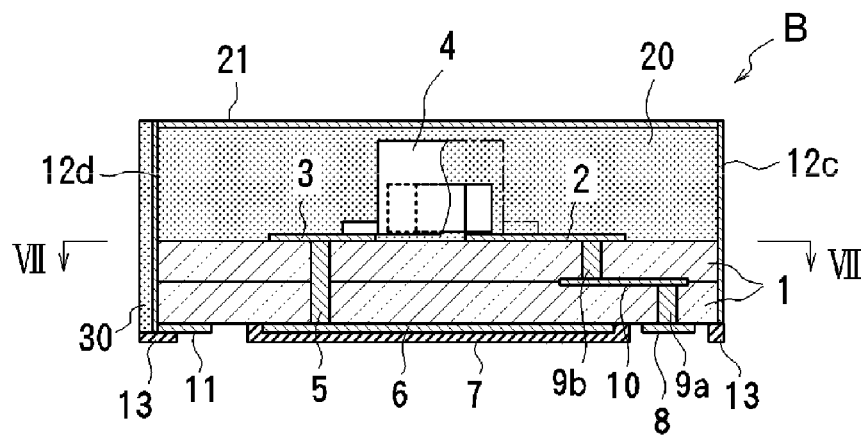
FIG. 6 is a sectional view of a circuit module according to a second preferred embodiment of the present invention.
Figure 7:
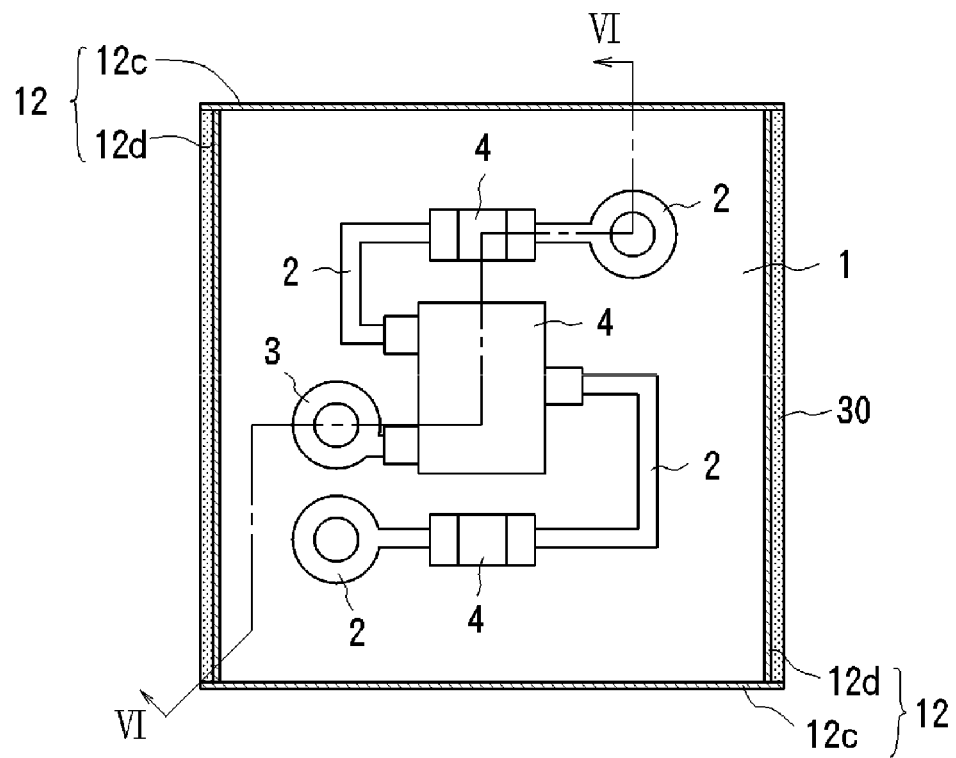
FIG. 7 is a sectional view taken along the line VII-VII of FIG. 6.
Figure 8:
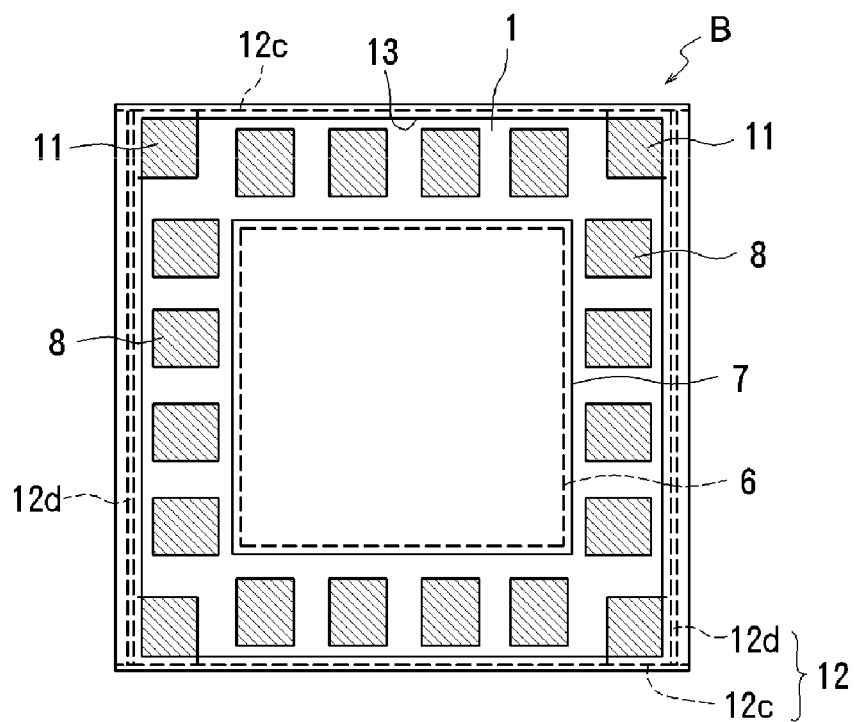
FIG. 8 is a bottom view of a module substrate of the circuit module shown in FIG. 6.

In FIGS. 6 to 8, a circuit module according to a second preferred embodiment is shown. The same elements as those according to the first preferred embodiment and elements corresponding to those according to the first preferred embodiment are denoted by the same reference numerals, and a description thereof is omitted. FIG. 6 is a sectional view taken along the step-formed cutting-plane line (the line VI-VI) of FIG. 7. FIG. 7 is a sectional view taken along the line VII-VII of FIG. 6. FIG. 8 is a bottom view.

In a circuit module B, electrode films 12c are formed along two opposed sides, and electrode films 12d are formed along the other two sides. The circuit module B is different from the circuit module A in that the side-surface-shielding layers 12 are defined by the electrode films 12c and 12b. Although the electrode films 12c are exposed to the outside, the electrode films 12d are covered by a filling material 30.

Figure 9A:
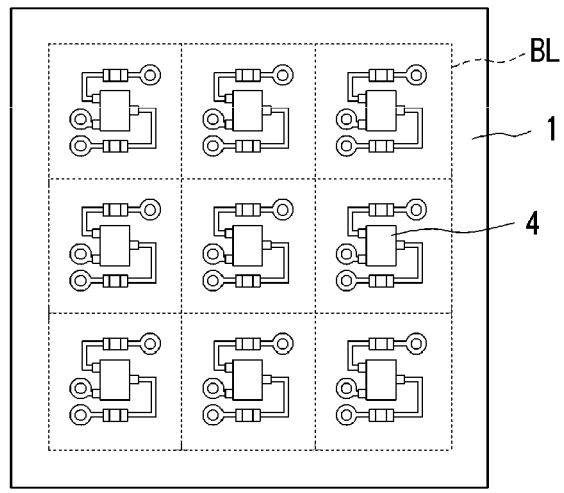
FIGS. 9A to 9C include plan views showing the first half of a manufacturing process of the circuit module shown in FIG. 6.
Figure 9B:
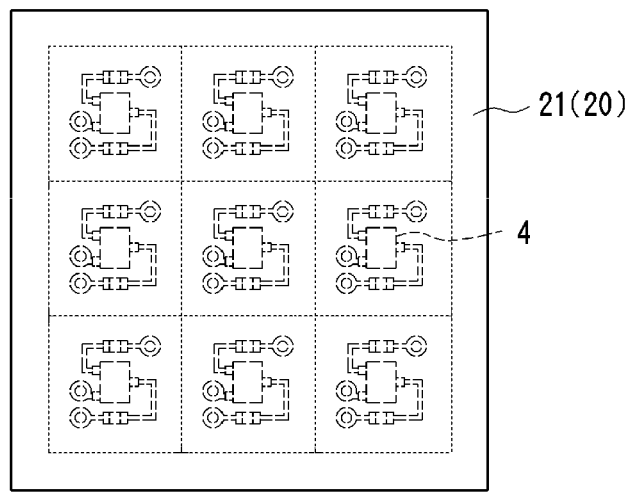

A method for manufacturing the circuit modules B according to the second preferred embodiment is shown in FIGS. 9A to 9F. FIGS. 9A and 9B are similar to FIGS. 4A and 4B.

Figure 9C:
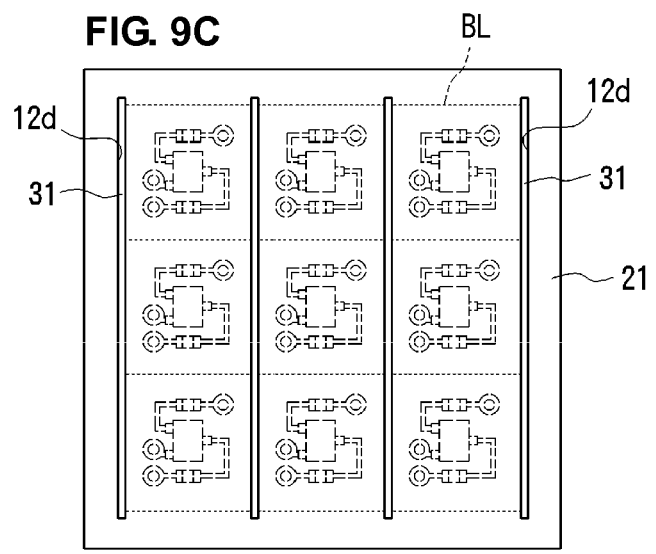

In FIG. 9C, a state is shown in which two or more first through holes 31 are formed in parallel in the module substrate 1 and the insulating resin layer 20 along two opposed sides of each small substrate so as to pass through in the thickness direction of the module substrate 1 and the insulating resin layer 20. The first through holes 31 are continuous slit-shaped long holes. Preferably, the first through holes 31 are formed such that both ends of each of the first through holes 31 extend to a margin between adjacent small substrates. The first through holes 31 are formed by punching, slicing with a blade, using a laser, or other suitable method. Then, on the inner surfaces of the first through holes 31, the electrode films 12d are formed by electroless plating or other suitable method so as to be connected to the top-surface-shielding layer 21.

Figure 9D:
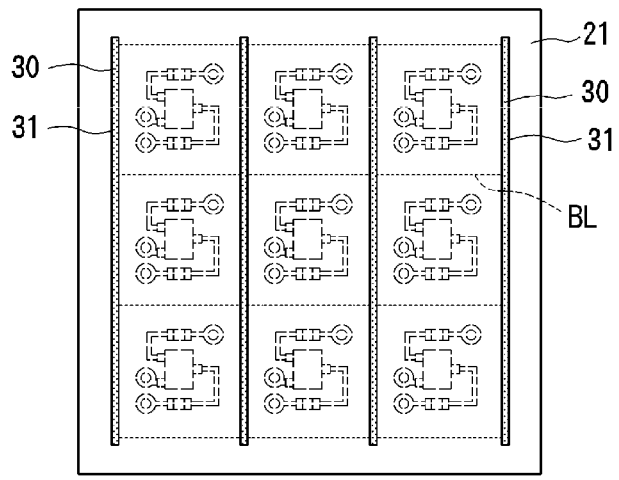
FIGS. 9D to 9F include plan views showing the second half of the manufacturing process of the circuit module shown in FIG. 6.

In FIG. 9D, a state is shown in which the first through holes 31 are filled with the filling material 30, and in which the filling material 30 is cured.

Figure 9E:
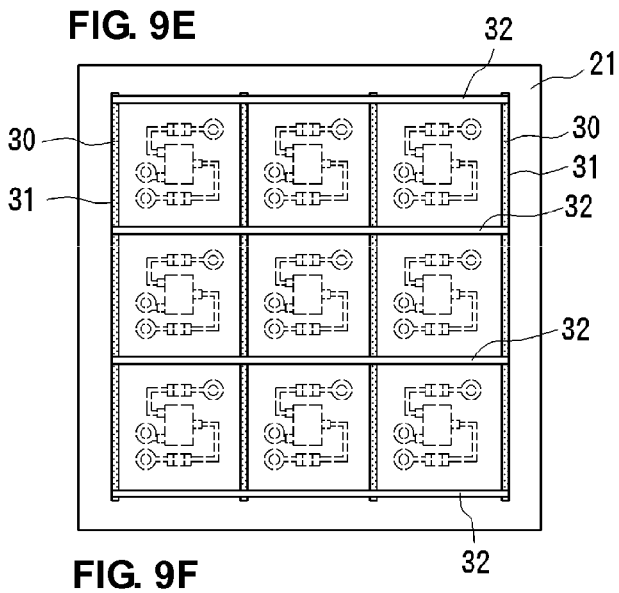

In FIG. 9E, a state is shown in which second through holes 32 are formed in the module substrate 1 and the insulating resin layer 20 in a direction substantially orthogonal to the first through holes 31, i.e., along the other two sides of each small substrate so as to pass through in the thickness direction of the module substrate 1 and the insulating resin layer 20. Both ends of each of the second through holes 32 extend to the filling material 30 on the left and right sides, with which the first through holes 31 are filled. In other words, both ends of each of the second through holes 32 extend to locations at which the electrode films 12d, which are formed on the inner surfaces of the first through holes 31, are cut. To prevent division of the aggregate substrate, each of the second through holes 32 must end such that each end of the second through hole 32 extends to the middle of the margin or before each end of the second through hole 32 extends to the middle of the margin. The second through holes 32 are formed in a manner similar to that used in the case of the first through holes 31.

On the inner surfaces of the second through holes 32, the electrode films 12c are formed by electroless plating or other suitable method so as to be connected to the top-surface-shielding layer 21 and the electrode films 12d. When the electrode films 12c are formed, small substrates are retained in the combined state by the filling material 30. Accordingly, the electrode films 12c can be formed as an aggregate substrate. Additionally, after the electrode films 12c are formed, the solder-resist films 7 and 13 are formed on the back surface of the module substrate 1, if necessary.

Figure 9F:
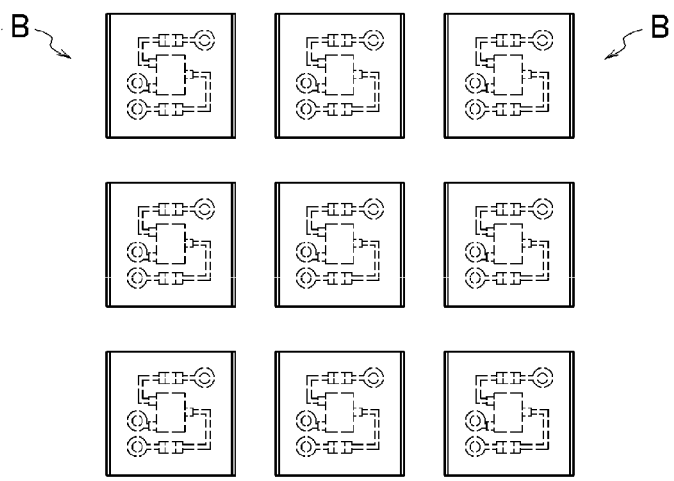

In FIG. 9F, a state is shown in which the module substrate 1 and the insulating resin layer 20 are divided into small substrates (circuit modules B). In other words, the filling material 30, with which the first through holes 31 are filled, is cut along the first through holes 31 such that the filling material 30 is divided, which results in the division into circuit modules B. In this case, grooves to be cut must have a width less than that of the first through holes 31 such that no damage occurs in the electrode films 12d, which are formed on the inner surfaces of the first through holes 31.

In the second preferred embodiment, when the second through holes 32 are formed, small substrates are retained in a combined state by the filling material 30, with which the first through holes 31 are filled. In other words, small substrates are retained in the combined state by the two opposed sides.

Accordingly, the retention strength is high, and an accidental separation of small substrates when the electrode films 12c are formed is prevented.

Third Preferred Embodiment

Figure 10:
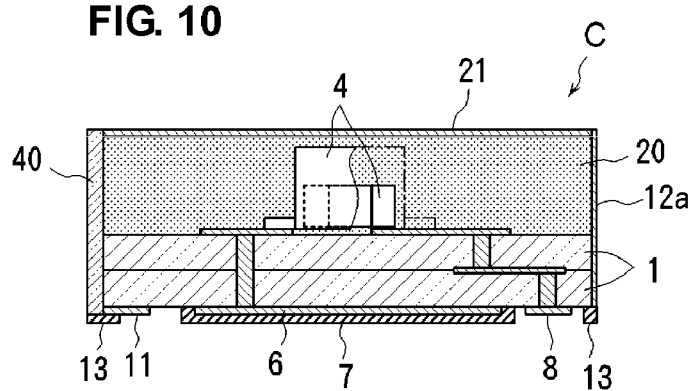
FIG. 10 is a sectional view of a circuit module according to a third preferred embodiment of the present invention.

In FIG. 10, a circuit module according to a third preferred embodiment is shown. The same elements as those according to the first preferred embodiment and elements corresponding to those according to the first preferred embodiment are denoted by the same reference numerals, and a description thereof is omitted. In the first preferred embodiment, after the electrode films 12b are formed on the inner surfaces of the first through holes 16, the first through holes 16 are filled with the filling material 15. However, in the third preferred embodiment, a filling material 40 composed of a conductive adhesive is used so that the filling material 40 can provide both functions.

Concave grooves 14 are formed in the corner portions of a circuit module C. The concave grooves 14 are filled with the filling material 40, which is composed of a conductive adhesive. The top and bottom ends of the filling material 40 are connected to the top-surface-shielding layer 21 and the ground terminal electrodes 11, which are formed on the back surface, respectively. In addition, both side ends of the filling material 40 are connected to the electrode films 12a, which are formed on the remaining surfaces that are the side surfaces. Consequently, the side-surface-shielding layers are formed of the filling material 40 and the electrode films 12a.

A method for using the conductive filling material 40 includes only filling the first through holes 16 with the conductive filling material 40, instead of a method according to the first preferred embodiment, which includes forming the electrode films 12b and filling the first through holes 16 with the filling material 15 after forming the first through holes 16. Accordingly, the number of processes is reduced as compared to that in the case of the first preferred embodiment.

Although not shown in FIG. 10, the configuration according to the third preferred embodiment can also be similarly applied to the configuration according to the second preferred embodiment. In this case, the filling material 40 can define both the electrode films 12d and the filling material 30. The top and bottom ends of the filling material 40 are connected to the top-surface-shielding layer 21 and the ground terminal electrodes 11, which are formed on the back surface, respectively. In addition, both side ends of the filling material 40 are connected to the electrode films 12c, which are formed on the remaining surfaces that are the side surfaces.

Fourth Preferred Embodiment

Figure 11:
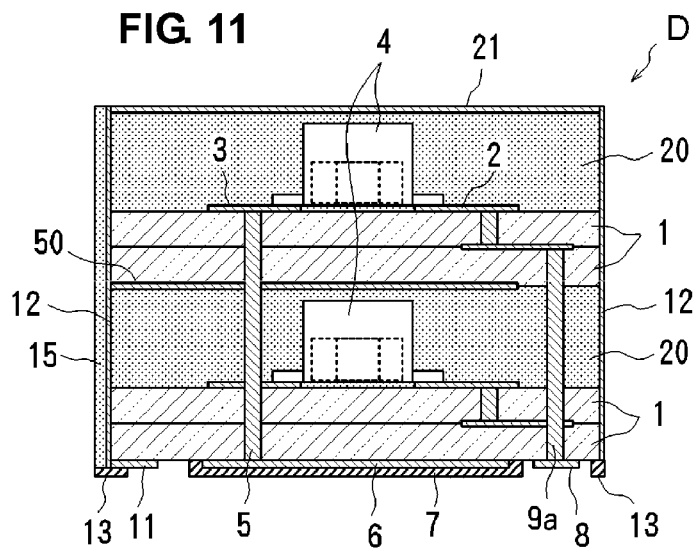
FIG. 11 is a sectional view of a circuit module according to a fourth preferred embodiment of the present invention.
Figure 12:
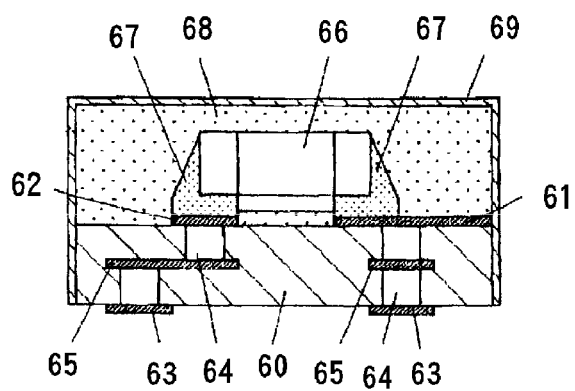
FIG. 12 is a sectional view of an example of a circuit module in the related art.

In FIG. 11, a circuit module according to a fourth preferred embodiment is shown. The same elements as those according to the first preferred embodiment and elements corresponding to those according to the first preferred embodiment are denoted by the same reference numerals, and a description thereof is omitted.

In a circuit module D according to this preferred embodiment, two component-embedding layers, each of which is a component-embedding layer according to the first preferred embodiment, are stacked. A shielding layer 50 provided between the two component-embedding layers is connected to the side-surface-shielding layers 12. Such a multi-layered configuration allows the circuit components 4 to have a high degree of integration, resulting in the miniaturization of a product. Additionally, because a shielding effect (an electromagnetically shielding effect) on a component-embedding layer other than an upper component-embedding layer can be obtained, a detrimental influence caused by signal leakage and extraneous noise is reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing circuit modules, the method comprising:
preparing a module substrate defined by an aggregate substrate including a plurality of small substrates;
mounting circuit components on the module substrate;
forming an insulating resin layer on substantially an entire top surface of the module substrate such that the circuit components are disposed in the insulating resin layer;
forming a first shielding layer on a top surface of the insulating resin layer;
forming first through holes in the module substrate and in the insulating resin layer at locations corresponding to portions of boundary lines of the plurality of small substrates so as to extend in a thickness direction of the module substrate and the insulating resin layer;
forming first electrode films in inner surfaces of the first through holes so as to be connected to the first shielding layer;
filling the first through holes with a filling material;
forming second through holes in the module substrate and the insulating resin layer at locations corresponding to the remaining portions of the boundary lines of the plurality of small substrates so as to extend in the thickness direction of the module substrate and the insulating resin layer;
forming second electrode films in inner surfaces of the second through holes so as to be connected to the first shielding layer and the first electrode films; and
cutting the filling material with which the first through holes are filled along the boundary lines of small substrates, resulting in a division of the aggregate substrate into the plurality of small substrates.

2. The method for manufacturing circuit modules according to claim 1, wherein the first through holes are formed at locations corresponding to four corner portions of each of the plurality of small substrates, and the second through holes are formed at locations corresponding to four sides of each of the plurality of small substrate.

3. The method for manufacturing circuit modules according to claim 1, wherein the first through holes are formed at locations corresponding to two opposed sides of each of the plurality of small substrates, and the second through holes are formed at locations corresponding to the other two sides of each of the plurality of small substrates.

4. The method for manufacturing circuit modules according to claim 1, wherein the electrode films are formed by plating.

5. The method for manufacturing circuit modules according to claim 1, wherein the filling material includes thermosetting resin.

6. A method for manufacturing circuit modules, the method comprising:
preparing a module substrate defined by an aggregate substrate including a plurality of small substrates;
mounting circuit components on the module substrate;
forming an insulating resin layer on substantially an entire top surface of the module substrate such that the circuit components are disposed in the insulating resin layer;
forming a first shielding layer on a top surface of the insulating resin layer;
forming first through holes in the module substrate and in the insulating resin layer at locations corresponding to portions of boundary lines of the plurality of small substrates so as to extend in a thickness direction of the module substrate and the insulating resin layer;
filling the first through holes with a conductive filling material;
forming second through holes in the module substrate and the insulating resin layer at locations corresponding to the remaining portions of the boundary lines of the plurality of small substrates so as to extend in the thickness direction of the module substrate and the insulating resin layer;
forming electrode films in inner surfaces of the second through holes so as to be connected to the first shielding layer and the conductive filling material; and
cutting the conductive filling material with which the first through holes are filled along the boundary lines of small substrates, resulting in a division of the aggregate substrate into the plurality of small substrates.

7. The method for manufacturing circuit modules according to claim 6, wherein the first through holes are formed at locations corresponding to four corner portions of each of the plurality of small substrates, and the second through holes are formed at locations corresponding to four sides of each of the plurality of small substrate.

8. The method for manufacturing circuit modules according to claim 6, wherein the first through holes are formed at locations corresponding to two opposed sides of each of the plurality of small substrates, and the second through holes are formed at locations corresponding to the other two sides of each of the plurality of small substrates.

9. The method for manufacturing circuit modules according to claim 6, wherein the electrode films are formed by plating.

10. The method for manufacturing circuit modules according to claim 6, wherein the filling material includes thermosetting resin.

11. A circuit module comprising:
a module substrate;
a circuit component mounted on a surface of the module substrate
an insulating resin layer provided on substantially an entire top surface of the module substrate such that the circuit component is disposed in the insulating resin layer;
a first shielding layer provided on a top surface of the insulating resin layer;
a second shielding layer continuously provided on all of side surfaces of the module substrate and the insulating resin layer, a top edge of the second shielding layer being connected to the first shielding layer;
concave grooves provided in four corner portions of the module substrate and the insulating resin layer, the concave grooves extending in a thickness direction of the module substrate and the insulating resin layer;
electrode films provided on inner surfaces of the concave grooves, the electrode films defining a portion of the second shielding layer; and
a filling material with which the concave grooves are filled, the filling material covering the electrode films.

12. The circuit module according to claim 11, wherein a ground terminal electrode is provided on a bottom surface of the module substrate, and a bottom edge portion of the second shielding layer is connected to the ground terminal electrode.

13. The circuit module according to claim 11, wherein the electrode films are defined by plated films.

14. The circuit module according to claim 11, wherein the filling material includes a thermosetting resin.

15. A circuit module comprising:
a module substrate;
a circuit component mounted on a surface of the module substrate;
an insulating resin layer provided on substantially an entire top surface of the module substrate such that the circuit component is disposed in the insulating resin layer;
a first shielding layer provided on a top surface of the insulating resin layer;
a second shielding layer continuously provided on all of side surfaces of the module substrate and the insulating resin layer, a top edge of the second shielding layer being connected to the first shielding layer;
electrode films exposed on side surfaces corresponding to two opposed sides of the module substrate and the insulating resin layer, the electrode films defining a portion of the second shielding layer;
electrode films provided on side surfaces corresponding to two sides other than the two opposed sides, the electrode films defining the other portion of the second shielding layer; and
a filling material covering the electrode films.

16. The circuit module according to claim 15, wherein a ground terminal electrode is provided on a bottom surface of the module substrate, and a bottom edge portion of the second shielding layer is connected to the ground terminal electrode.

17. The circuit module according to claim 15, wherein the electrode films are defined by plated films.

18. The circuit module according to claim 15, wherein the filling material includes a thermosetting resin.

19. A circuit module comprising:
a module substrate;
a circuit component mounted on a surface of the module substrate;
an insulating resin layer provided on substantially an entire top surface of the module substrate such that the circuit component is disposed in the insulating resin layer;

a first shielding layer provided on a top surface of the insulating resin layer;

a second shielding layer continuously provided on all of side surfaces of the module substrate and the insulating resin layer, a top edge of the second shielding layer being connected to the first shielding layer;

concave grooves provided in four corner portions of the module substrate and the insulating resin layer, the concave grooves extending in a thickness direction of the module substrate and the insulating resin layer; and a conductive filling material with which the concave grooves are filled, the conductive filling material defining a portion of the second shielding layer.

20. The circuit module according to claim 19, wherein a ground terminal electrode is provided on a bottom surface of the module substrate, and a bottom edge portion of the second shielding layer is connected to the ground terminal electrode.

21. The circuit module according to claim 19, wherein the electrode films are defined by plated films.

22. The circuit module according to claim 19, wherein the filling material includes a thermosetting resin.

23. A circuit module comprising:

a module substrate;

a circuit component mounted on a surface of the module substrate;

an insulating resin layer provided on substantially an entire top surface of the module substrate such that the circuit component is disposed in the insulating resin layer;

a first shielding layer provided on a top surface of the insulating resin layer;

a second shielding layer continuously provided on all of side surfaces of the module substrate and the insulating resin layer, a top edge of the second shielding layer being connected to the first shielding layer;

electrode films exposed on side surfaces corresponding to two opposed sides of the module substrate and the insulating resin layer, the electrode films defining a portion of the second shielding layer; and a conductive filling material covering side surfaces corresponding to sides other than the two opposed sides, the electrode films defining the other portion of the second shielding layer.

24. The circuit module according to claim 23, wherein a ground terminal electrode is provided on a bottom surface of the module substrate, and a bottom edge portion of the second shielding layer is connected to the ground terminal electrode.

25. The circuit module according to claim 23, wherein the electrode films are defined by plated films.

26. The circuit module according to claim 23, wherein the filling material includes a thermosetting resin.

\* \* \* \* \*